US009846922B2

(12) United States Patent
Hilbert et al.

(10) Patent No.: US 9,846,922 B2
(45) Date of Patent: Dec. 19, 2017

(54) METHOD, COMPUTER READABLE MEDIUM AND MRI APPARATUS FOR PERFORMING PHASE-ENCODE GHOSTING DETECTION AND MITIGATION IN MRI

(71) Applicant: SIEMENS HEALTHCARE GMBH, Erlangen (DE)

(72) Inventors: Tom Hilbert, Lausanne (CH); Gunnar Krueger, Watertown-Boston, MA (US)

(73) Assignee: Siemens Healthcare GmbH, Erlangen (DE)

( * ) Notice: Subject to any disclaimer, the term of this patent is extended or adjusted under 35 U.S.C. 154(b) by 29 days.

(21) Appl. No.: 14/948,599

(22) Filed: Nov. 23, 2015

(65) Prior Publication Data
US 2016/0148351 A1    May 26, 2016

(30) Foreign Application Priority Data
Nov. 21, 2014  (EP) .................... 14194280

(51) Int. Cl.
G06K 9/40     (2006.01)
G06K 9/00     (2006.01)
G06T 5/00     (2006.01)
G01R 33/56    (2006.01)
G01R 33/561   (2006.01)
(Continued)

(52) U.S. Cl.
CPC .......... *G06T 5/002* (2013.01); *G01R 33/5608* (2013.01); *G01R 33/5611* (2013.01); *G01R 33/56509* (2013.01); *G06T 7/0012* (2013.01); *G06T 2207/10004* (2013.01); *G06T 2207/10088* (2013.01)

(58) Field of Classification Search
None
See application file for complete search history.

(56) References Cited

U.S. PATENT DOCUMENTS

2004/0207402 A1   10/2004  Kellman et al.
2006/0273792 A1   12/2006  Kholmovski et al.
(Continued)

OTHER PUBLICATIONS

Mortamet B. et al: "Automatic Quality Assessment in Structural Brain Magnetic Resonance Imaging", Magnetic Reonance in Medicine, vol. 62, No. 2, pp. 365-372, XP055184612,ISSN: 0740-3194, DOI: 10.1002/mrm.21992 / Dec. 6, 2009.

(Continued)

*Primary Examiner* — Sean Conner
(74) *Attorney, Agent, or Firm* — Laurence Greenberg; Werner Stemer; Ralph Locher

(57) ABSTRACT

A method detects phase-encoding ghosting in a MR image of an object to be imaged and mitigates the corresponding artifact in the MR image. The method includes acquiring MRI raw data of the object by a MRI apparatus. The MRI apparatus has multiple receiver channels for acquiring the MRI raw data. An artifact map of at least one part of the object to be imaged is calculated from the MRI raw data, the artifact map is configured for highlighting artifact appearing in the MR image. An outlier mask representing detected phase-encoding artifact is created in the artifact map. The phase-encode ghosting in the MR image is mitigated by using the previously obtained artifact map and the outlier mask for obtaining an improved MR image.

6 Claims, 3 Drawing Sheets

(51) Int. Cl.
*G01R 33/565* (2006.01)
*G06T 7/00* (2017.01)

(56) References Cited

U.S. PATENT DOCUMENTS

| | | | |
|---|---|---|---|
| 2011/0311158 A1* | 12/2011 | Griswold | G01R 33/56509 |
| | | | 382/275 |
| 2012/0133361 A1 | 5/2012 | Gross | |
| 2015/0268324 A1* | 9/2015 | Zhai | G01R 33/56509 |
| | | | 324/309 |
| 2016/0216352 A1* | 7/2016 | Eggers | G01R 33/5608 |

OTHER PUBLICATIONS

Griswold M et al: "Generalized Autocalibrating Partially Parallel Acquisitions (GRAPPA)", Magnetic Resonance in Medicine, John Wiley & Sons, Inc. US, vol. 47, pp. 1202-1210, XP002369548, ISSN: 0740-3194, DOI: 10.1002/MRM.10171 / Jan. 6, 2002.

* cited by examiner

METHOD, COMPUTER READABLE MEDIUM AND MRI APPARATUS FOR PERFORMING PHASE-ENCODE GHOSTING DETECTION AND MITIGATION IN MRI

CROSS-REFERENCE TO RELATED APPLICATION

This application claims the priority, under 35 U.S.C. §119, of European application EP 141 94 280.5, filed Nov. 21, 2014; the prior application is herewith incorporated by reference in its entirety.

BACKGROUND OF THE INVENTION

Field of the Invention

The present invention relates generally to phase-encode ghosting detection and mitigation in magnetic resonance imaging (MRI).

For diagnosis and monitoring the inflammatory disease multiple sclerosis (MS) the brain lesion load and atrophy are important markers. Manual and automated image analyses of magnetic resonance (MR) images are performed to obtain these markers to support the radiologist to quantify the progress of the disease. MRI is, however, sensitive to technical and physiological effects that can cause image artifacts. One of these artifacts is phase-encode ghosting.

Phase-encode ghosting arises when the true phase of the spins and the phase corresponding to their spatial position differ. The phase inconsistency appears when a collection of spins moves between phase-encoding and read-out encoding, for example due to head-motion, flow of blood and cerebrospinal fluid (CSF) or pulsation of vessels, among others. The image artifact appears as ghosting along the phase-encoding direction and can be misinterpreted as a lesion, thus negatively affect the lesion load assessment. The phase-encode ghosting can be exemplarily observed in 2D fluid attenuated inversion recovery (FLAIR) and turbo spin echo (TSE) images at the posterior fossa and is significantly amplified after a gadolinium injection due to higher signal from blood.

The effect of phase-encoding ghosting is decreased when the signal emitted from the moving spins is attenuated. In case of blood flow, this can be performed by using a pre-saturation slab at the neck; hence the signal of blood flowing into the imaging volume is attenuated. Another approach to minimize the effect of flow is to reduce the phase shift using flow compensation or gradient moment nulling. These methods are adjustments applied during the acquisition and may have impact on acquisition duration and image contrast, thus are non-ideal solutions for the problem.

SUMMARY OF THE INVENTION

An objective of the present invention is to provide a method and a device for detecting phase-encoding ghosting in MRI and mitigating the corresponding artifact in the image for improving subsequent post-processing and analysis.

The objective is achieved according to the present invention with respect to a computer-implemented method for detecting phase-encoding ghosting in a MR image of an object to be imaged and mitigating the corresponding artifact in the MR image. The computer-implemented method includes:

acquiring MRI raw data of the object by a MRI apparatus, wherein the MRI apparatus contains multiple receiver channels for acquiring the MRI raw data;

calculating an artifact map of at least one part of the object to be imaged from the MRI raw data, the artifact map is in particular configured for highlighting artifacts appearing in the MR image;

creating an outlier mask representing detected phase-encoding artifact in the artifact map; and mitigating phase-encode ghosting in the MR image by using the previously obtained artifact map and the outlier mask for obtaining an improved MR image.

When calculating the artifact map the following further steps are performed by generating a new k-space, with altered artifact energy, (hereafter duplicate k-space) based on a fully-sampled centric-ordered and non-interleaved k-space (hereafter original k-space) that represents the MRI raw data. In particular the duplicate k-space might be generated by using generalized auto-calibrating partially parallel acquisition (GRAPPA).

In this case, the duplicate k-space of the original k-space is obtained by determining a linear dependence of a sample in the original k-space on its neighboring voxels, along the multiple receiver channels, by fitting weights in a least squares sense to obtain an optimal weighted average of neighbors to yield the desired k-space voxel. This set of weights is hereafter referred as interpolation kernel. The linear dependence previously determined is applied onto each sample in the original k-space using the beforehand fitted weights (i.e. interpolation kernel) for obtaining the duplicate k-space.

The duplicate k-space with the original k-space for obtaining the artifact map is subtracted. Advantageously, the duplicate k-space is identical to the original k-space only if the assumption of linear dependency applies to all k-space samples in the original k-space. MRI data, however, does not ideally obey this assumption of linearity due to imaging-artifacts, for example noise, RF field inhomogeneity, B0 inhomogeneity, geometric distortion due to gradient non-uniformity, phase-encoding ghosting, among others. The signal energy of k-space samples that not linearly depend on its neighbors is than erroneously convolved with the interpolation kernel. This convolution corresponds to a multiplication of the artifacts in image space with the inverse Fourier transformed interpolation kernel. This leads to a spatially dependent attenuation of the artifacts. When subtracting now the duplicate image, i.e. inverse Fourier transform of the duplicate k-space, with the original image, the signal energy, corresponding to the assumption of linear dependency, cancels out. Thus, the residual consists of all non-linear dependent signals, namely the spatially attenuated artifacts and noise from the duplicate image, forming the artifact map. Advantageously, the duplication can be performed with interpolation kernels of arbitrary size, however, 1D-kernels, where only dependencies on neighbouring samples from different phase-encode lines are considered, are preferred within the present invention, since they yield a better distinction of artifacts.

The creation of the outlier mask comprises applying first a threshold t, and second and optionally, a morphological erode operator to separate high intensity ghosting from background noise in the artifact map. For example, the threshold t might be determined by the following equation:

$$t = \bar{X} + 3\sigma \qquad (\text{Eq. 1}),$$

where $\bar{X}$ denotes the mean and $\sigma$ the standard deviation of voxels in the artifact map. The outlier mask is then obtained by applying the threshold t to the artifact map for selecting voxels representing locations where the corresponding k-space samples strongly disobey the previously mentioned assumption of linear dependency to neighboring samples. Optionally, a morphological erode operator is applied to remove single-voxel outliers, effectively separating noise artifacts from the here targeted phase-encode ghosting. A morphological erode operation similar to that described in the document by Mortamet et al. "Automatic Quality Assessment in Structural Brain Magnetic Resonance Imaging" (Magnetic Resonance in Medicine 62: 365-372 (2009)) might be used for improving the detection of artifacts. The outlier mask is in particular used to generate a quality index for each MR image column perpendicular to the phase-encoding lines. In particular, the present invention proposes a similar metric as used for global image quality assessments disclosed in Mortamet et al., and proposes to calculate a quality index $Q_{col}$ defined as follows:

$$Q_{col} = \frac{\Sigma_{i \in X_{out}} i}{N_{lin}}, \quad \text{(Eq. 2)}$$

with $N_{lin}$ being the number of phase encoding steps and i the voxels belonging to the outlier mask $X_{out}$. Information about the value of the quality index $Q_{col}$ that reflects the presence or absence of artifacts in the MR image is preferentially overlaid onto the MR image (see FIG. 4).

The mitigating phase-encode ghosting in the MR image includes replacing each image voxel of the inverse Fourier transformed original k-space that is indicated as artifactual in the outlier mask by the corresponding image voxel of the duplicate for obtaining the improved MR image. Indeed, the duplicate contains voxels representing the imaged object, attenuated ghosting artifacts and additional reconstruction noise. In order to mitigate ghosting artifacts in the MR image, image voxels of the duplicate, where ghosting artifacts were attenuated, are used to replace image voxels in the inverse Fourier transformed original k-space in order to mitigate phase-encode ghosting. Each voxel in the duplicate image, i.e. each duplicate voxel, corresponds to a voxel in the inverse Fourier transformed original k-space, i.e. of an original voxel. In other words, the present invention proposes to use each duplicate voxel appearing in the outlier mask and representing an attenuated phase-encode ghosting for replacing its corresponding original voxel.

The present invention also concerns a computer readable medium containing a memory for storing computer executable instructions and configured for performing the previously described method when executing said instructions.

Finally, the present invention also concerns a MRI apparatus for imaging an object, the MRI apparatus being configured for performing the method steps previously described.

Other features which are considered as characteristic for the invention are set forth in the appended claims.

Although the invention is illustrated and described herein as embodied in a method, a computer readable medium and a MRI apparatus for performing phase-encode ghosting detection and mitigation in MRI, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
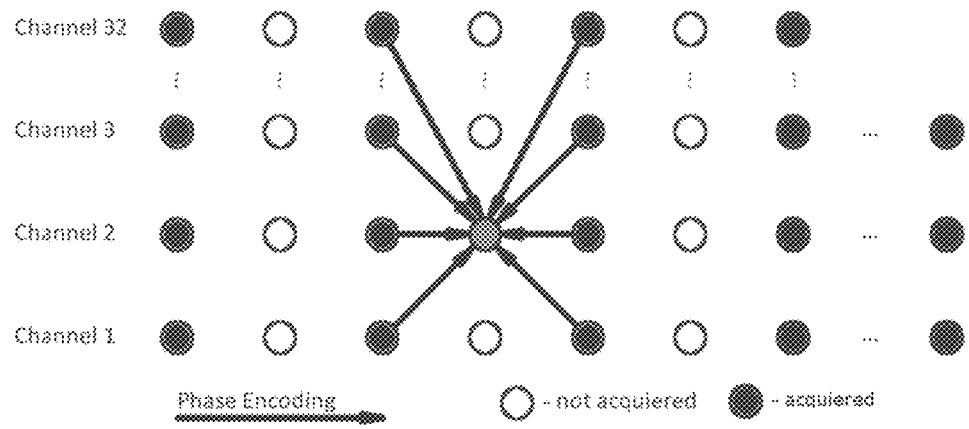
FIG. 1 is a schematic illustration of linear dependency in parallel magnet resonance imaging, using multiple receiver channels.

The present invention proposes in particular to use a GRAPPA navigator technique to generate the duplicate of the original k-space, notably by using GRAPPA interpolation kernels. GRAPPA is a parallel imaging method based on the assumption that a k-space sample can be interpolated if the measurement was performed with multiple receiver channels by a MRI apparatus. The interpolation kernels exploit the linear dependency of a sample in k-space on its neighboring voxels, along multiple channels. FIG. 1 illustrates this linear dependency. According to the present invention, the linear dependency is first trained on all samples of the original dataset (i.e. original k-space) and then used to interpolate each single sample of the original k-space for obtaining the duplicate.

Figure 2:
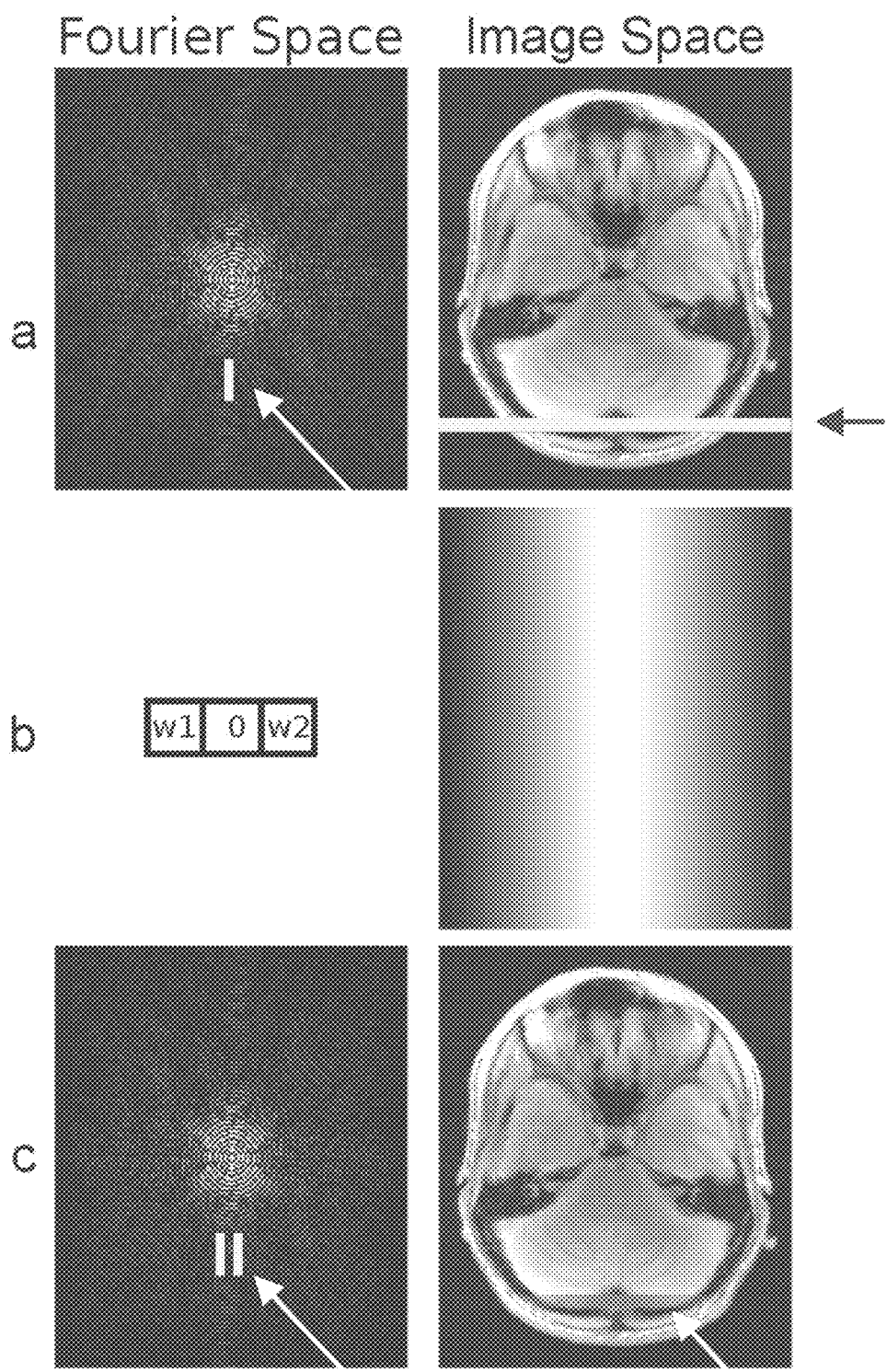
FIG. 2 is an illustration of k-space (left) and image space (right) corresponding to the original (row a), an interpolation kernel (row b) and a duplicate (row c) according to the invention.

The propagation of artifacts in the different images and spaces (k-space (left) and image space (right) of the original k-space (row a), the interpolation kernel (row b) and the duplicate (row c)) is illustrated in FIG. 2 and pointed out with arrows. In interest of clarity the channel dimension is neglected in the illustration.

Figure 3:
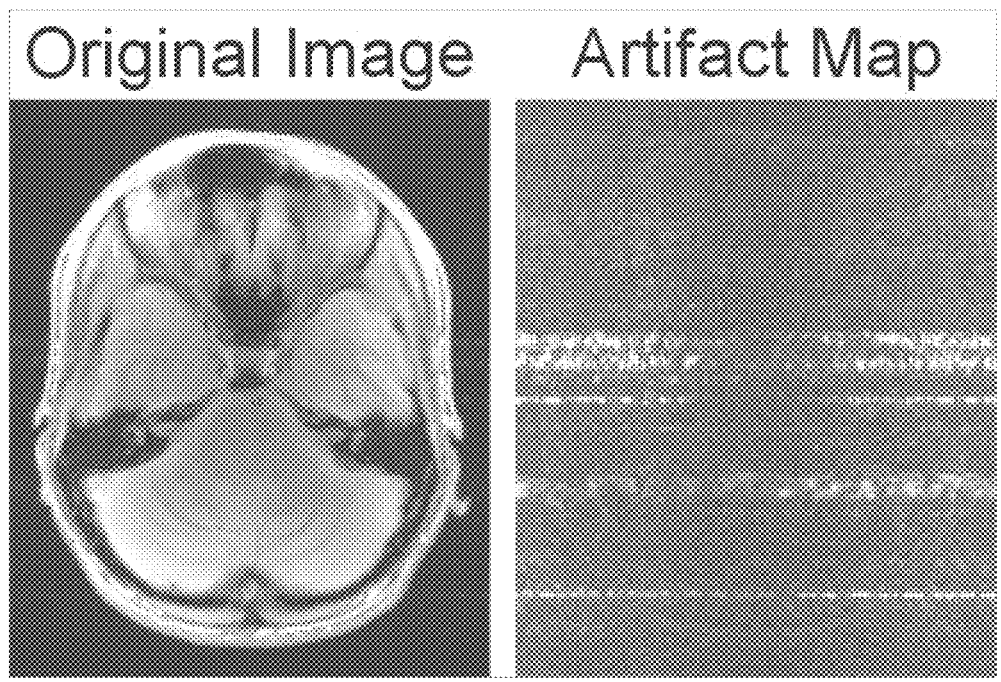
FIG. 3 is an illustration of a residual (right) of the original (left) and its duplicate, forming an artifact map according to the invention.

FIG. 3 illustrates an artifact map (right) obtained according to the present invention from an original MR image (left) and showing phase-encode ghosting perpendicular to phase-encode lines due to blood-flow.

Figure 4:
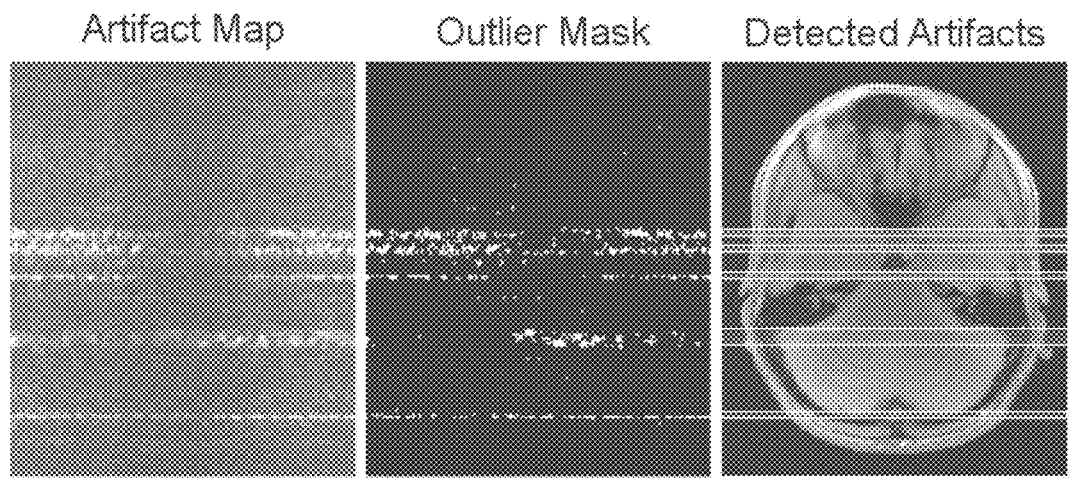
FIG. 4 is an exemplary artifact map (left), detected outliers (middle) and column wise quality index overlaid onto the original image (right) according to the invention.

A threshold t is then applied to the artifact map for obtaining an outlier mask as represented in FIG. 4 (middle). Preferentially, a column (i.e. lines perpendicular to the phase encoding direction) wise quality index might be added to the MR image for showing a decreased image quality, e.g. typically observed at the occipital sinus, transverse sinuses, basilar artery and internal carotid arteries due to phase-encoding ghosting by means of overlaying quality image information onto the original MR image (see the right image "detected artifacts" in FIG. 4, wherein white lines highlight quality index information overlaid areas).

Figure 5:
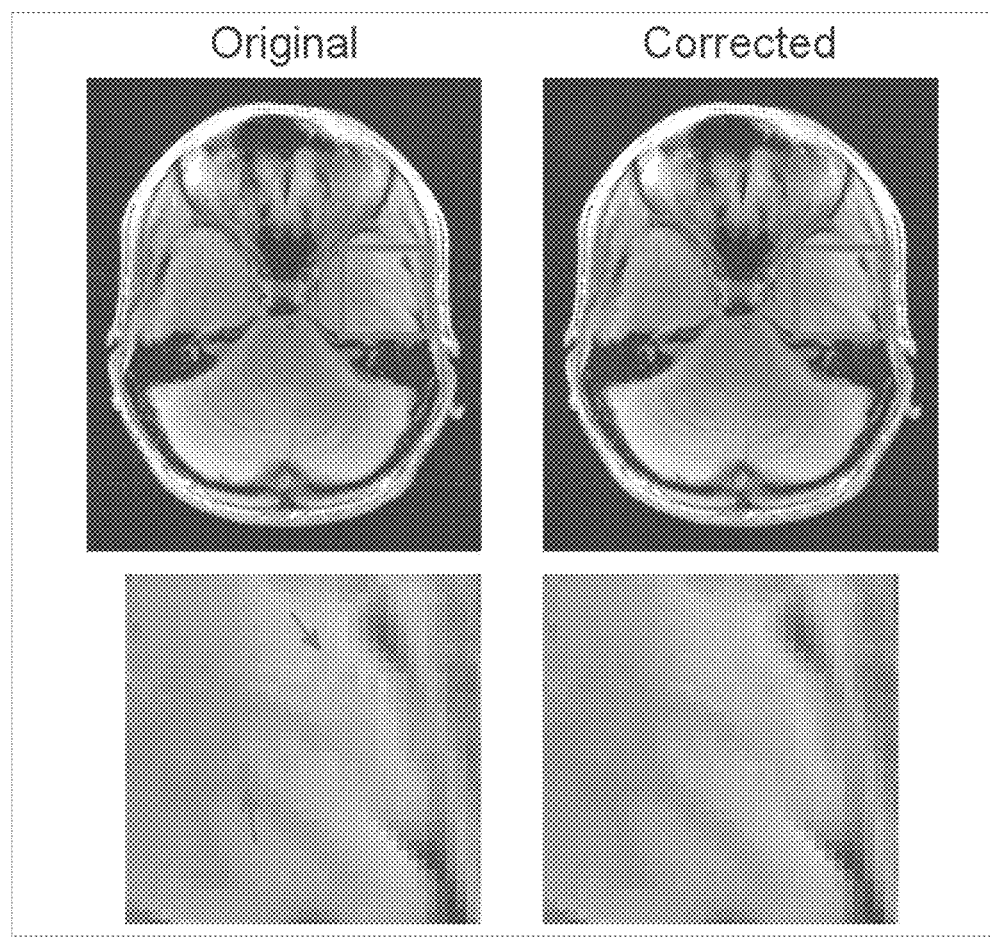
FIG. 5 is an illustration of an original image (left) in comparison to its corrected image (right) with zooming on the left temporal lobe (bottom).

An illustration of a phase-encode ghosting mitigated image is represented in FIG. 5, wherein an original image (left) is compared to its corrected image (right) according to the invention. A zooming on the left temporal lobe (bottom) shows that the ghosting artifacts (arrows) are mitigated in the corrected image.

The invention claimed is:

1. A computer-implemented method for detecting phase-encoding ghosting in a magnetic resonance (MR) image of an object to be imaged and mitigating a corresponding artifact in the MR image, the computer-implemented method comprises the steps of:
  acquiring magnetic resonance imaging (MRI) raw data of the object by means of a MRI apparatus, the MRI apparatus having multiple receiver channels for acquiring the MRI raw data;
  calculating an artifact map of at least one part of the object to be imaged from the MRI raw data, the step of calculating the artifact map including:
    generating a duplicate k-space based on an original k-space being a fully-sampled centric-ordered and non-interleaved k-space including the MRI raw data, and
    inverse Fourier transforming a subtraction of the duplicate k-space from the original k-space for obtaining the artifact map;
  creating an outlier mask representing detected phase-encoding artifacts in the artifact map; and
  mitigating phase-encode ghosting in the MR image by using the artifact map and the outlier mask for obtaining an improved MR image by replacing each image voxel of an inverse Fourier transformed original k-space that is indicated as artefactual in the outlier mask by a corresponding image voxel of an inverse Fourier transformed duplicate k-space for obtaining the improved MR image.

2. The computer-implemented method according to claim 1, which further comprises generating the duplicate k-space using a generalized auto-calibrating partially parallel acquisition (GRAPPA) interpolation kernel.

3. The computer-implemented method according to claim 1, wherein the step of creating the outlier mask further includes applying a threshold t to separate high intensity ghosting from background noise in the artifact map.

4. The computer-implemented method according to claim 3, which further comprises applying a morphological erode operator for improving a detection of artifacts in the MR image.

5. A non-transitory computer readable medium, comprising:
  a non-transitory memory storing computer executable instructions for detecting phase-encoding ghosting in a magnetic resonance (MR) image of an object to be imaged and mitigating corresponding artifact in the MR image, the computer executable instructions including instructions for performing the steps of:
    acquiring magnetic resonance imaging (MRI) raw data of the object by means of a MRI apparatus, the MRI apparatus having multiple receiver channels for acquiring the MRI raw data;
  calculating an artifact map of at least one part of the object to be imaged from the MRI raw data, the step of calculating the artifact map including:
    generating a duplicate k-space based on an original k-space being a fully-sampled centric-ordered and non-interleaved k-space including the MRI raw data, and
    inverse Fourier transforming a subtraction of the duplicate k-space from the original k-space for obtaining the artifact map;
  creating an outlier mask representing detected phase-encoding artifacts in the artifact map; and
  mitigating phase-encode ghosting in the MR image by using the artifact map and the outlier mask for obtaining an improved MR image by replacing each image voxel of an inverse Fourier transformed original k-space that is indicated as artefactual in the outlier mask by a corresponding image voxel of an inverse Fourier transformed duplicate k-space for obtaining the improved MR image.

6. A magnetic resonance imaging apparatus for imaging an object, the magnetic resonance imaging apparatus being configured for performing the method steps of claim 1 in order to obtain an improved MR image of the object.

* * * * *